(12) United States Patent
Yin et al.

(10) Patent No.: US 7,443,183 B2
(45) Date of Patent: Oct. 28, 2008

(54) MOTHERBOARD TEST MACHINE

(75) Inventors: Chia-Pin Yin, Shenzhen (CN); Yi-Li Chou, Shenzhen (CN); Wen-Zhi Liu, Shenzhen (CN); Shun-Qiu You, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 73 days.

(21) Appl. No.: 11/306,488

(22) Filed: Dec. 29, 2005

(65) Prior Publication Data

US 2007/0152694 A1    Jul. 5, 2007

(51) Int. Cl.
*G01R 31/02* (2006.01)
(52) U.S. Cl. .................. 324/755; 324/758; 324/765
(58) Field of Classification Search .......... 324/754–762
See application file for complete search history.

(56) References Cited

U.S. PATENT DOCUMENTS

| | | | | |
|---|---|---|---|---|
| 4,705,438 A | * | 11/1987 | Zimmerman et al. | 409/132 |
| 4,718,531 A | * | 1/1988 | Bianchi et al. | 193/17 |
| 4,812,754 A | * | 3/1989 | Tracy et al. | 324/754 |
| 5,572,144 A | * | 11/1996 | Davidson et al. | 324/755 |
| 5,831,160 A | * | 11/1998 | Steketee | 73/431 |
| 6,259,265 B1 | * | 7/2001 | Han et al. | 324/761 |
| 6,441,630 B1 | * | 8/2002 | Obikane et al. | 324/758 |
| 6,509,754 B2 | | 1/2003 | Lin et al. | |
| 6,900,648 B2 | * | 5/2005 | Ou et al. | 324/755 |
| 2002/0079914 A1 | * | 6/2002 | Song | 324/761 |

* cited by examiner

*Primary Examiner*—Ha Nguyen
*Assistant Examiner*—Arleen M Vazquez
(74) *Attorney, Agent, or Firm*—Wei Te Chung (57) ABSTRACT

A test machine for testing a printed circuit board (PCB) (50) includes a base box (10), a top test device (70), a raising board (41), and a control system. The top test device is pivotably secured to the base box, for testing the PCB. The raising board carries the PCB to be tested, and is upliftably secured on the base box. The control system controls lifting of the raising board up, thereby connecting the PCB with the top test device during testing.

2 Claims, 12 Drawing Sheets

MOTHERBOARD TEST MACHINE

FIELD OF THE INVENTION

The present invention relates to a printed circuit board test machine, and more particularly to a motherboard test machine.

DESCRIPTION OF RELATED ART

The computer has become widely used in modern life. The demand for computers is increasing nowadays due to their diversity and various applications. The objective is to provide users with high quality products. Hence, quality control and testing of products plays an important role in mass production.

Most manufacturers use test machines to test their newly produced components or devices. Take the motherboard for example. The motherboard is first placed on the test machine and linked to computer components, such as some kind of peripheral equipment or apparatus, or an interface card and so forth. Then the test machine is started and tests the motherboards circuitry. The period of the testing directly influences the time of production. Analyzing the forgoing test procedures, it takes a lot of time to insert and remove the peripheral equipment, apparatus, interface card, and so forth. The steps described above are carried out manually. It consumes a lot of time to assemble the test machine for testing a motherboard, and the process is vulnerable to mistakes. Connecting pins may become crooked or even snapped due to negligence or frequent insertion and removal of the computer components.

Conventionally, a test machine includes a function test box, a carrier, and a shingle. A probe load board on the function test box has a number of probes on its surface. The carrier, which is disposed above the function test box and has a number of guide holes, is capable of carrying a motherboard to be tested. The locations of the guide holes, the probes, and pins on the bottom of the motherboard to be tested are interrelated. When the carrier is moved downward into position, the probes insert into the guide holes and connect to the pins of the motherboard to be tested. The shingle is disposed above the carrier and has a number of presser bar members or press sticks on its bottom surface, the press sticks fix the motherboard to be tested to the carrier. Before testing, the computer components, such as the peripheral equipment, apparatus, and interface card, are assembled in the function test box. Pins of the computer components in the function test box couple to the probes on the probe load board.

In the beginning of the testing, the motherboard to be tested is placed on the carrier, and the shingle and the carrier are moved downward. The probes are guided into the guide holes of the carrier and couple to the pins on the bottom surface of the motherboard to be tested and then testing begins. When the testing is completed, the shingle and the carrier are lifted and the motherboard is replaced with the next one to be tested. It improves the speed of testing by utilizing the probes instead of manually inserting and removing the computer components.

However, in rotating the carrier down on the conventional test machine, the probes are often inexactly inserted into the guide holes and do not connect to the pins of the motherboard properly thus requiring manual intervention to correct the matter. This is time consuming, which adds greatly to the cost of manufacture.

What is needed, therefore, is a motherboard test machine which can position the motherboard with improved accuracy, thus reducing costs.

SUMMARY OF INVENTION

A test machine for testing a PCB includes a base box, a top test device, a raising board, and a control system. The top test device is pivotably secured to the base box, for testing the PCB. The raising board carries the PCB to be tested, and is upliftably secured on the base box. The control system controls lifting of the raising board up, thereby connecting the PCB with the top test device during testing.

Other advantages and novel features will be drawn from the following detailed description of preferred embodiments with attached drawings, in which:

DETAILED DESCRIPTION

Figure 1:
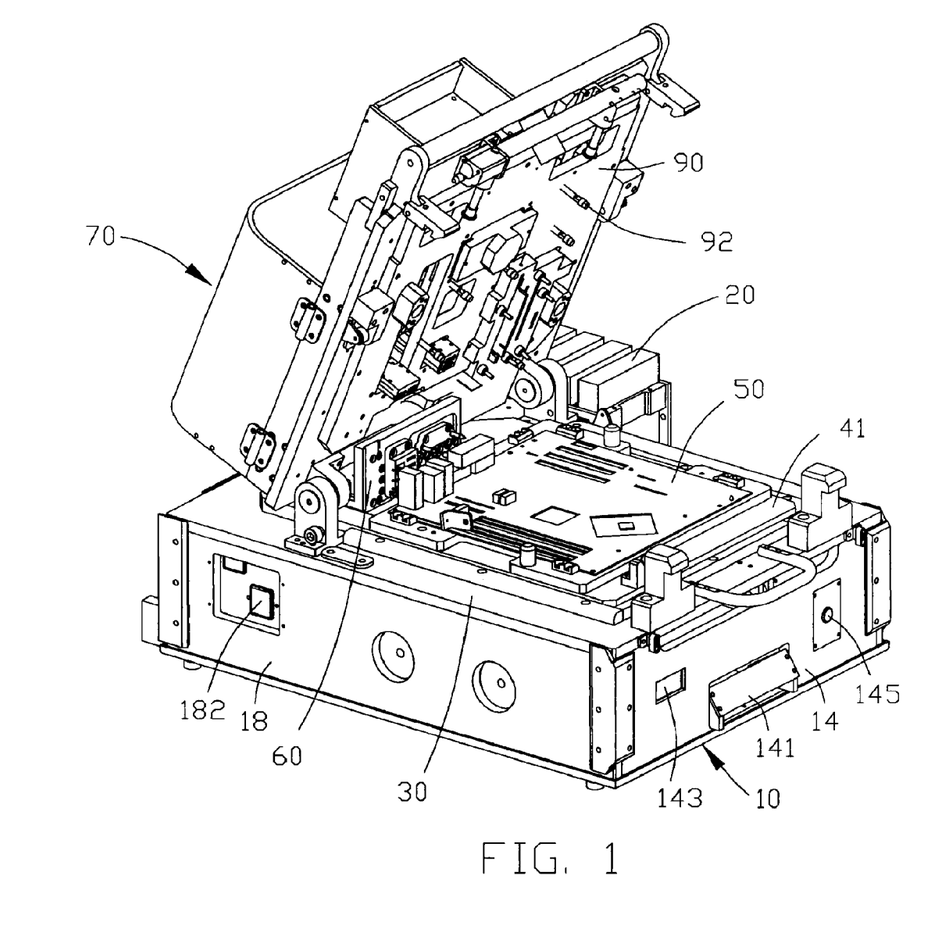
FIG. 1 is an assembled, isometric view of a motherboard test machine in accordance with a preferred embodiment of the present invention, together with a motherboard, the motherboard test machine including a base box, a rear test device, and a top test device.
Figure 4:
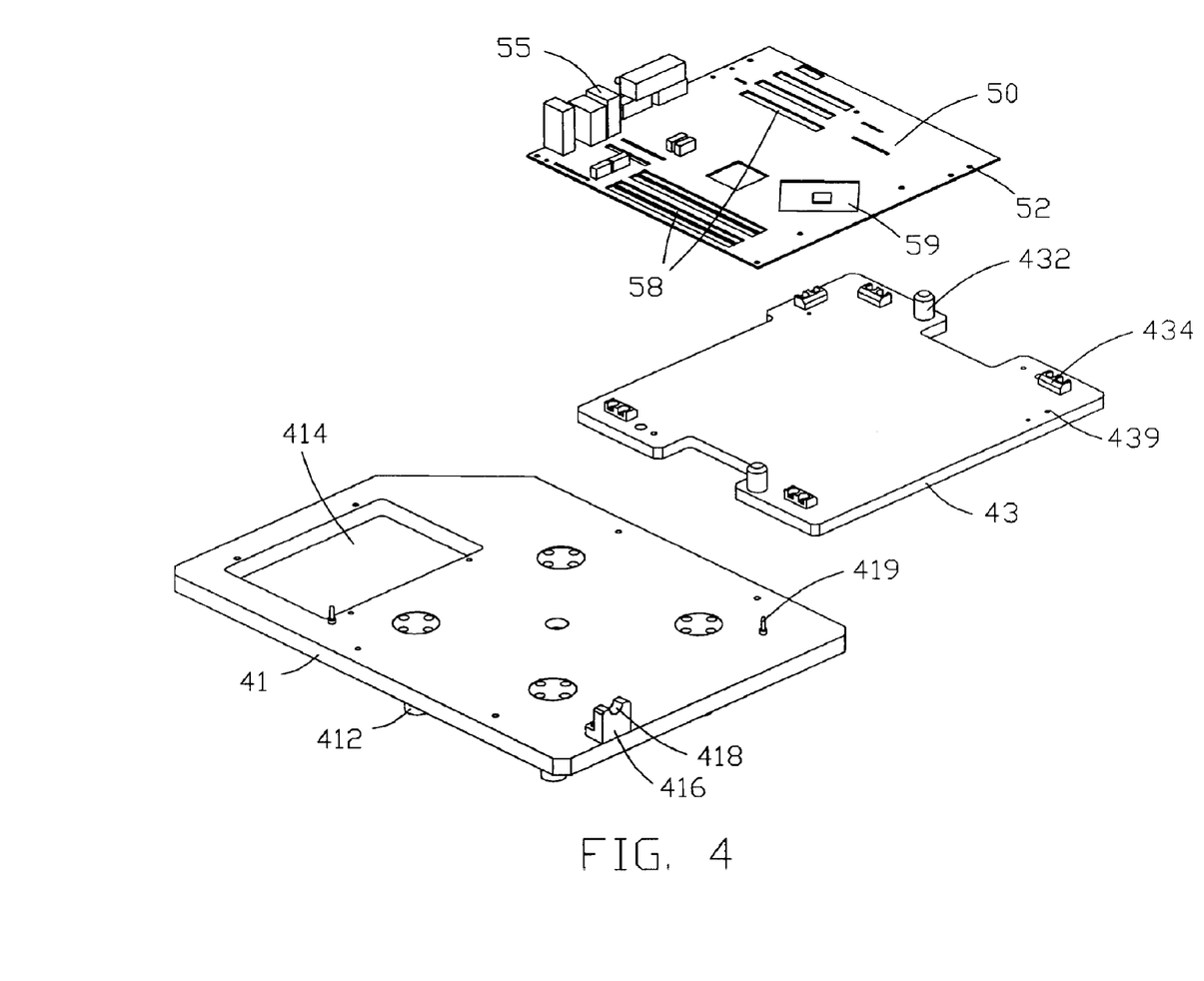
FIG. 4 is an exploded, isometric view of a raising board, a positioning board, and a motherboard.

Referring to FIGS. 1 and 4, a test machine is provided to test a printed circuit board (PCB), such as a motherboard 50, for quality control. A plurality of I/O ports 55 is disposed at an edge of the motherboard 50. The motherboard 50 defines a plurality of PCI slots 58 therein, for receiving PCI sockets, such as EMS memory sockets, graphic card sockets and so on. The motherboard 50 further includes a CPU socket 59, for receiving a CPU (not shown). A plurality of securing holes 52 is defined in the motherboard 50. The test machine includes a base box 10, a rear test device 60, a top test device 70, and a controlling system.

Figure 2:
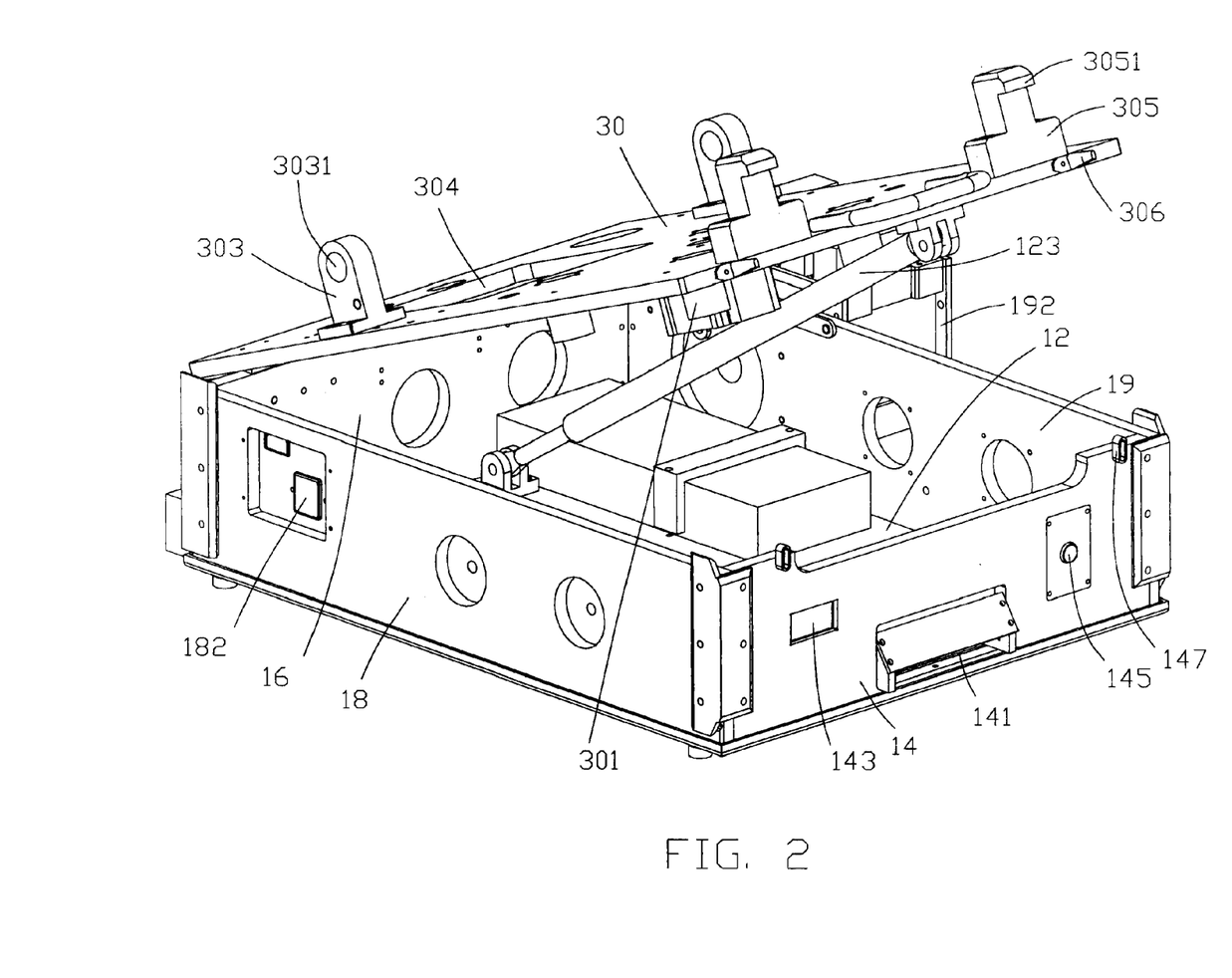
FIG. 2 is an assembled view of the base box, the base box including a loading board which is in an unlocked position.
Figure 3:
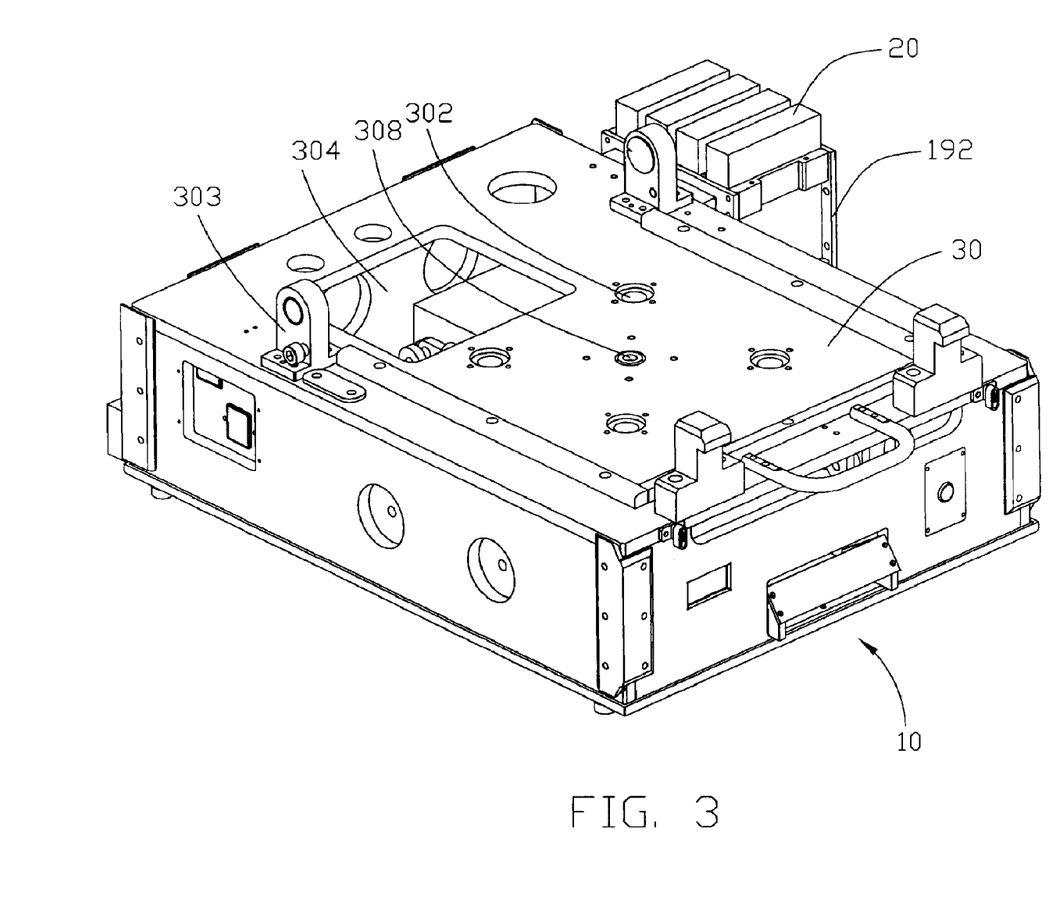
FIG. 3 is similar to FIG. 2, but showing the loading board in a locked position to cover the base box.

Referring also to FIGS. 2 and 3, the base box 10 includes a bottom plate 12, a front plate 14, a rear plate 16, a right plate 18, a left plate 19, and a loading board 30. The front plate 14, the rear plate 16, the right plate 18, and the left plate 19 are perpendicular to and bent up from edges of the bottom plate 12. A first display panel 141 is formed on a generally middle portion of the front plate 14, for displaying the status of the testing process. A second display panel 143 is formed on a left side of the first display panel 141, for displaying the test results. A button switch 145 is disposed on a left side of the first display panel 141. A pair of locking blocks 147 is pivotably disposed on the front plate 14. A power switch 182 is installed on a rear portion of the right plate 18, for controlling the power of the test machines. A bracket 192 is provided on the left plate 19, for securing a plurality of hard disk drives 20 therein.

The loading board 30 is pivotably secured to a top edge of the rear plate 16. A pair of pivot portions 303, each with a pivot hole 3031 defined therein, is secured to right and left edges of a top surface of the loading board 30, and adjacent to a rear edge of the loading board 30. A pair of hook portions 305, each having a generally L-shaped hook 3051, is disposed at a front edge of the top surface of the loading board 30. A large rectangular through opening 304 is defined in the loading board 30, between the pivot portions 303. An air cylinder 301 is secured to a bottom surface of the loading board 30, with a driving post 308 inserting through the top surface of the loading board 30. A plurality of through holes 302 is defined in corners of a rectangular square around the driving post 308 of the air cylinder 301. A pair of securing clips 306 is formed at a front edge of the loading board 30. When the locking blocks 147 of the front plate 14 of the base box 10 engage with the securing clips 306 of the loading board 30 respectively, the loading board 30 is thus secured on the base box 10, as shown in FIG. 3. The loading board 30 is further connected with the bottom plate 12 of the base box 10 with a retractable arm 123. Thus, the loading board 30 can be rotated up and down when the retractable arm 123 extends and retracts, as best shown in FIG. 2.

Figure 5:
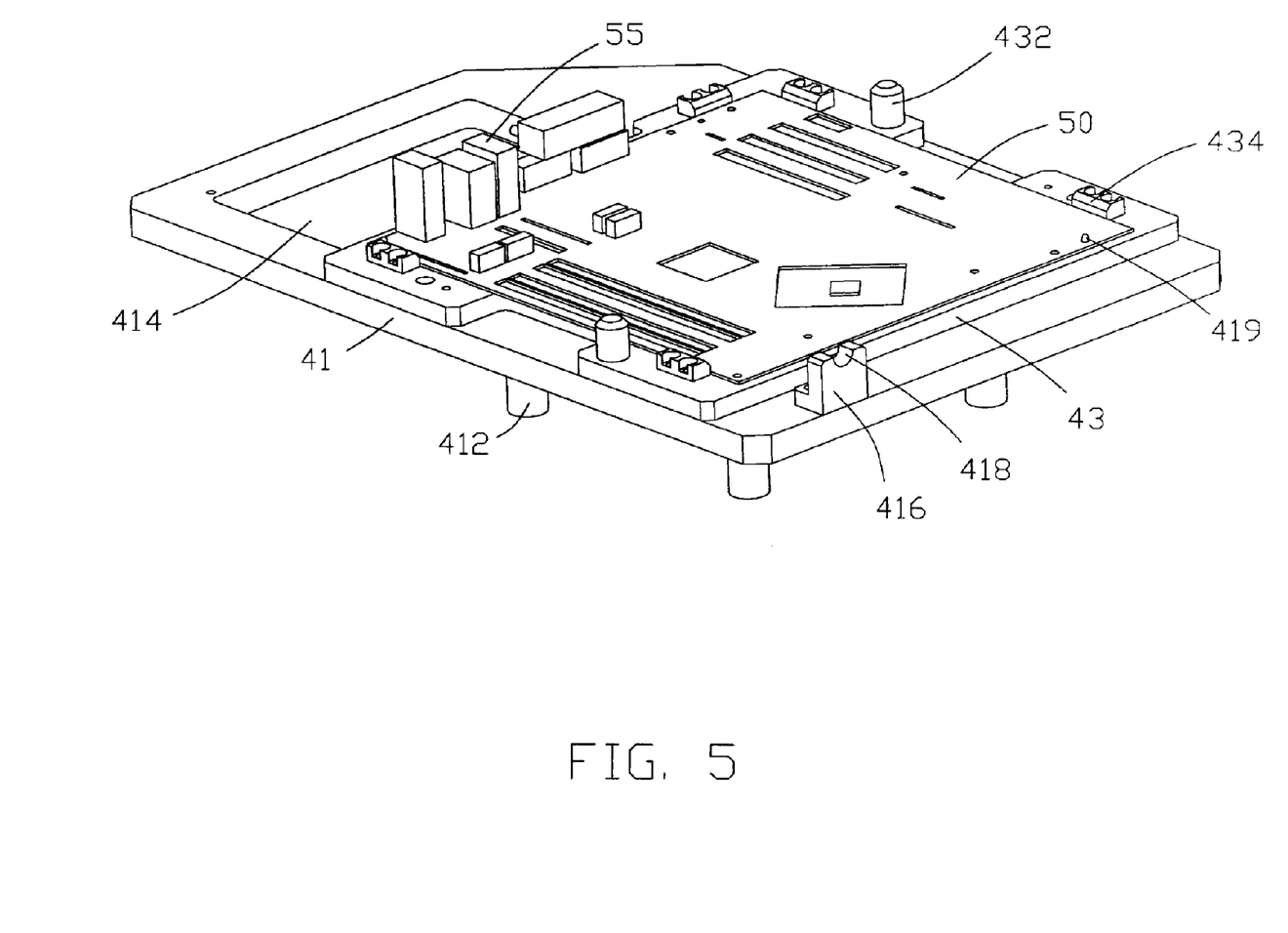
FIG. 5 is an assembled view of FIG. 4.

Referring also to FIGS. 4 and 5, a raising board 41 is upliftably installed on the loading board 30. A small opening 414 is defined in the raising board 41, corresponding to the large through opening 304 of the loading board 30. A plurality of sliding posts 412 is disposed on a bottom surface of the raising board 41, corresponding to the through holes 302 of the loading board 30. A locating portion 416 is formed at a front edge of a top surface of the raising board 41. A cutout 418 is defined in a top end of the locating portion 416. Two locating pins 419 are arranged on the surface of the raising board 41. When the raising board 41 is installed on the loading board 30, the driving post 308 of the air cylinder 301 can drive the raising board 41 to raise and fall.

The motherboard 50 is positioned on the raising board 41 with a positioning board 43. A plurality of blocking portions 434 is formed at adjacent edges of the positioning board 43, for positioning the motherboard 50 on the positioning board 43. Two guiding poles 432 are formed at two opposite edges of the positioning board 43. Two positioning holes 439 are defined in the positioning board 43, for receiving the locating pins 419 of the raising board 41. When loading the motherboard 50, the motherboard 50 is firstly mounted to the positioning board 43, and the combination of the motherboard 50 and the positioning board 43 is then positioned on the raising board 41.

Figure 6:
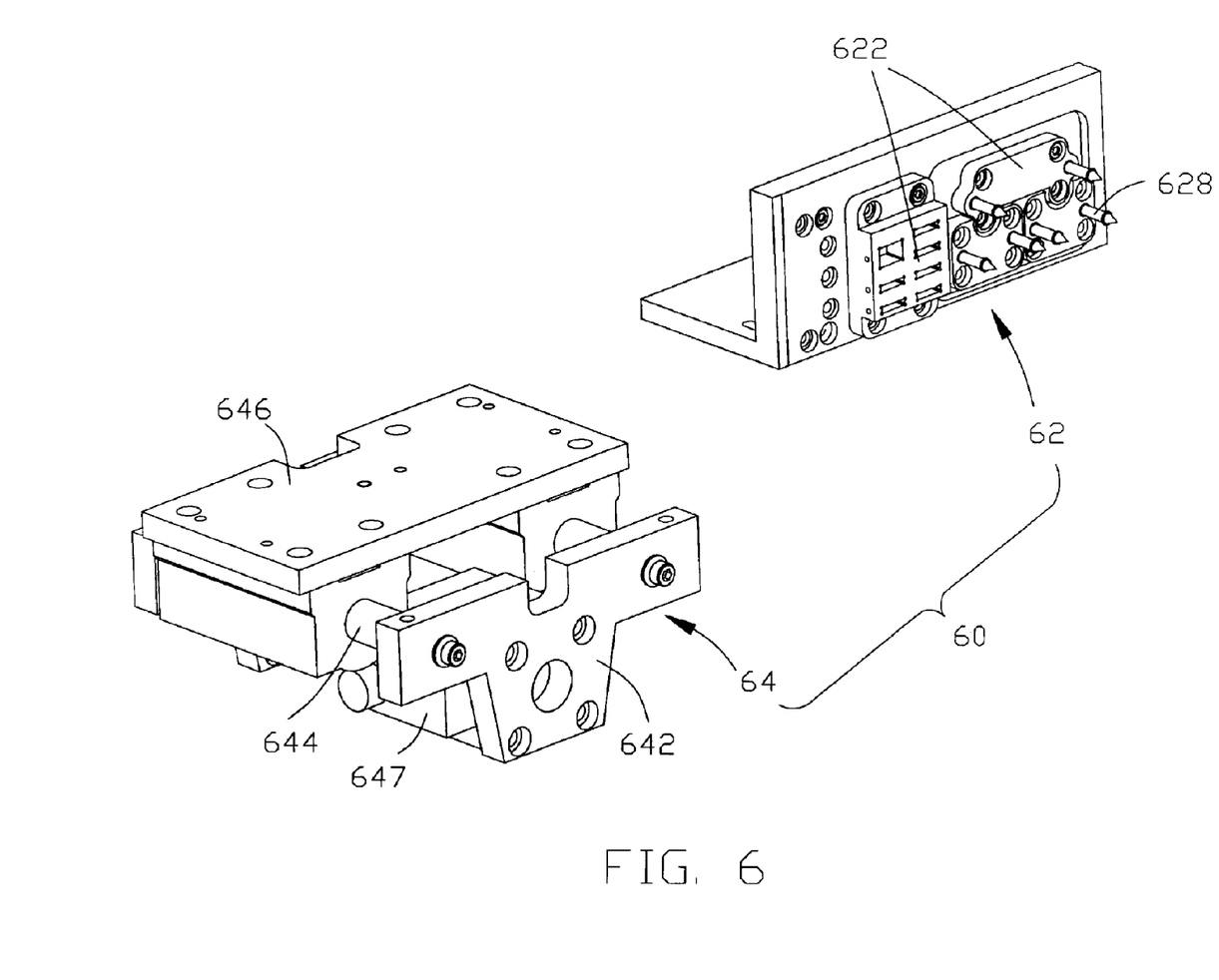
FIG. 6 is exploded, isometric view of the rear test device, the test device including a driving base, and a test board.
Figure 7:
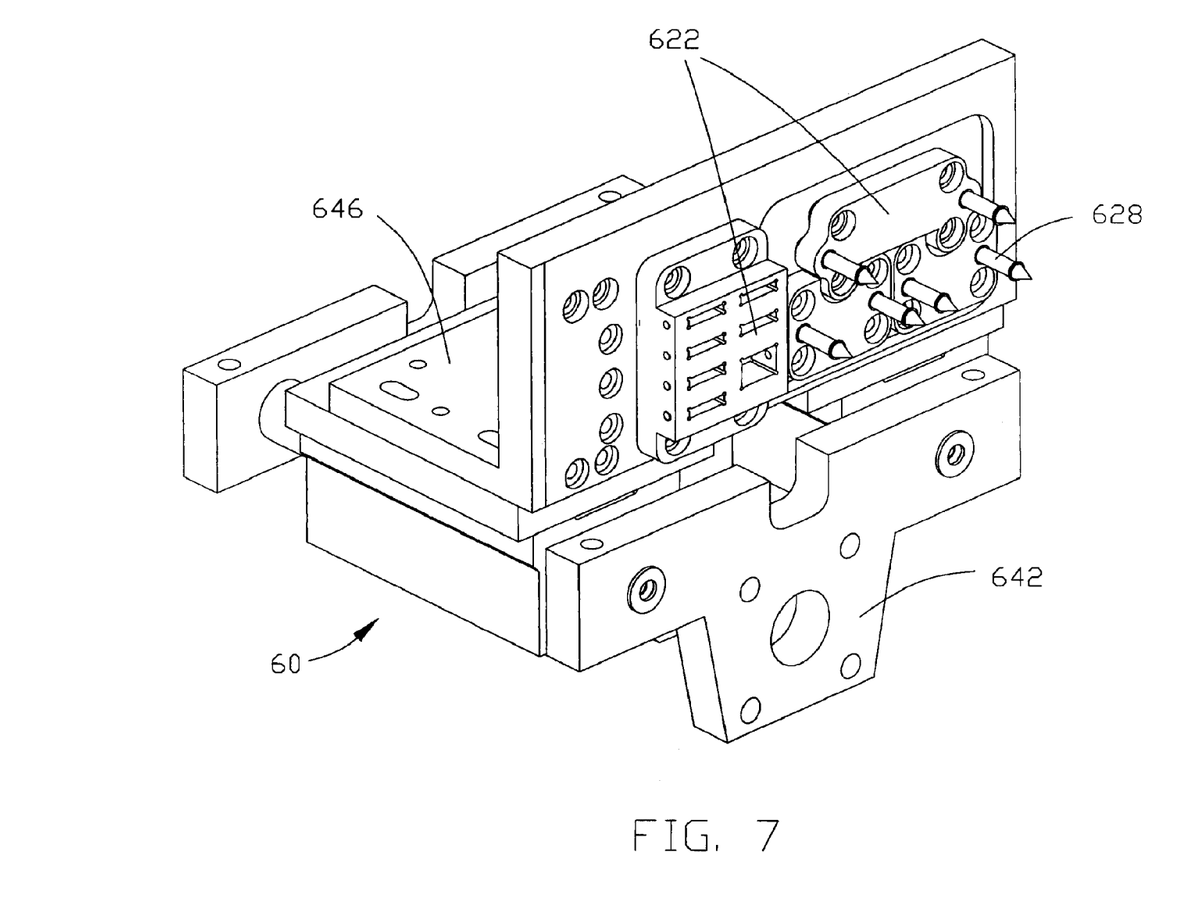
FIG. 7 is an assembled view of FIG. 6.

Referring also to FIGS. 6 and 7, the rear test device 60 includes a generally L-shaped test board 62, and a driving base 64. A plurality of test ports 622 and guiding pins 628 are formed on the test board 62. The driving base 64 includes a generally T-shaped securing board 642, and a sliding body 646. The sliding body 646 is slidingly installed on the securing board 642 with a pair of guiding shafts 644. An air cylinder 647 is secured to a bottom of the driving base 64, for driving the sliding body 646 to slide. The test board 62 is secured on a top of the sliding body 646. Thus, the test board 62 can also slide relative to the driving base 64.

Figure 8:
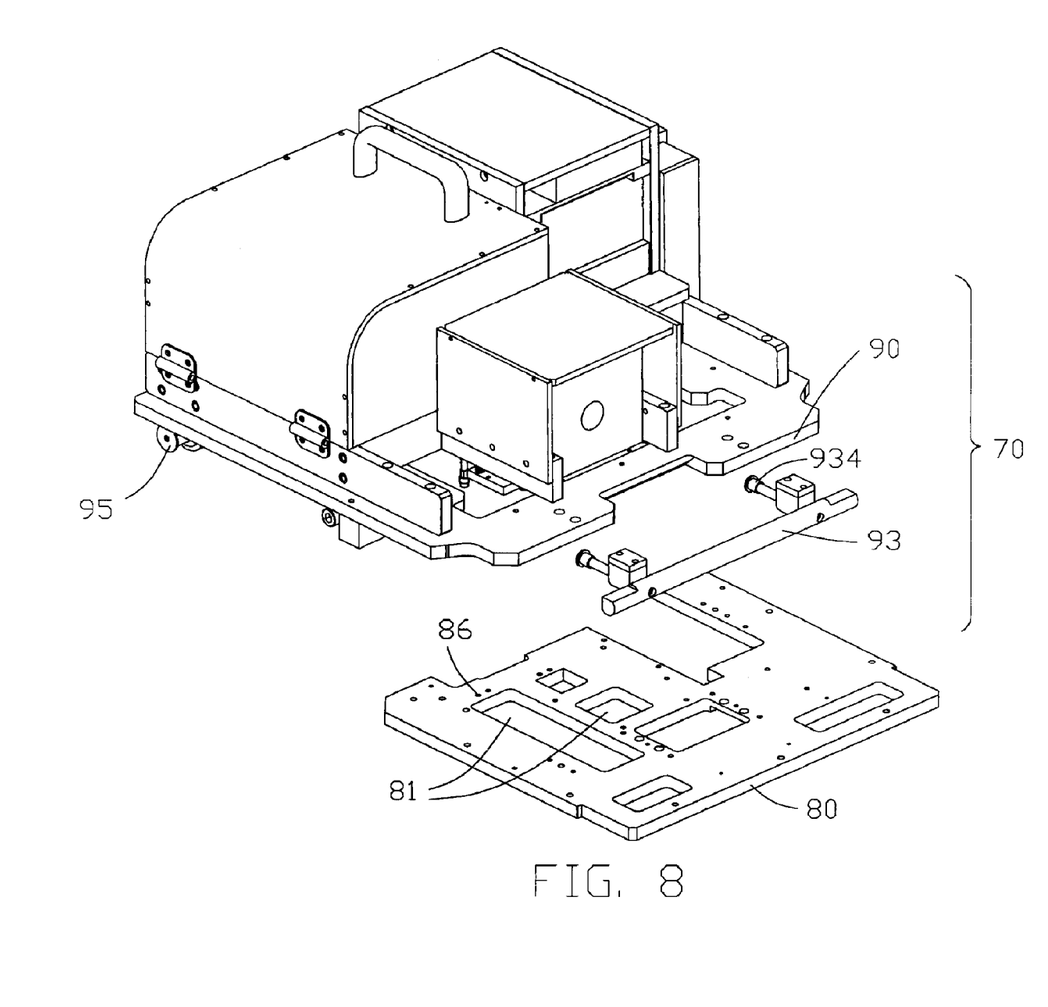
FIG. 8 is an exploded, isometric view of the top test device, the top device including a top test board, a handle, and a blocking board.

Referring also to FIGS. 1 and 8, the top test device 70 includes a top testing board 90, and a blocking board 80 secured to the top testing board 90. A plurality of peripheral elements, such as an EMS memory, a graphic card, and a CPU heat dissipating device and so on, is installed on the top testing board 90. A pair of pivot posts 95 is disposed on a bottom surface of the top testing board 90, corresponding to the pivot holes 3031 of the pivot portions 303 of the loading portion 30. A plurality of blocking posts 92 is formed on a bottom surface of the top testing board 90, as shown in FIG. 1. A handle 93 is installed on the top testing board 90 with a pair of retractable connecting shafts 934, corresponding to the hooks 3051 of the loading board 30. The blocking board 80 defines a plurality of through openings 81 for the peripheral elements of the top testing board 90 inserting therethrough, and a plurality of through holes 86 for the blocking posts 92 inserting therethrough.

Figure 9:
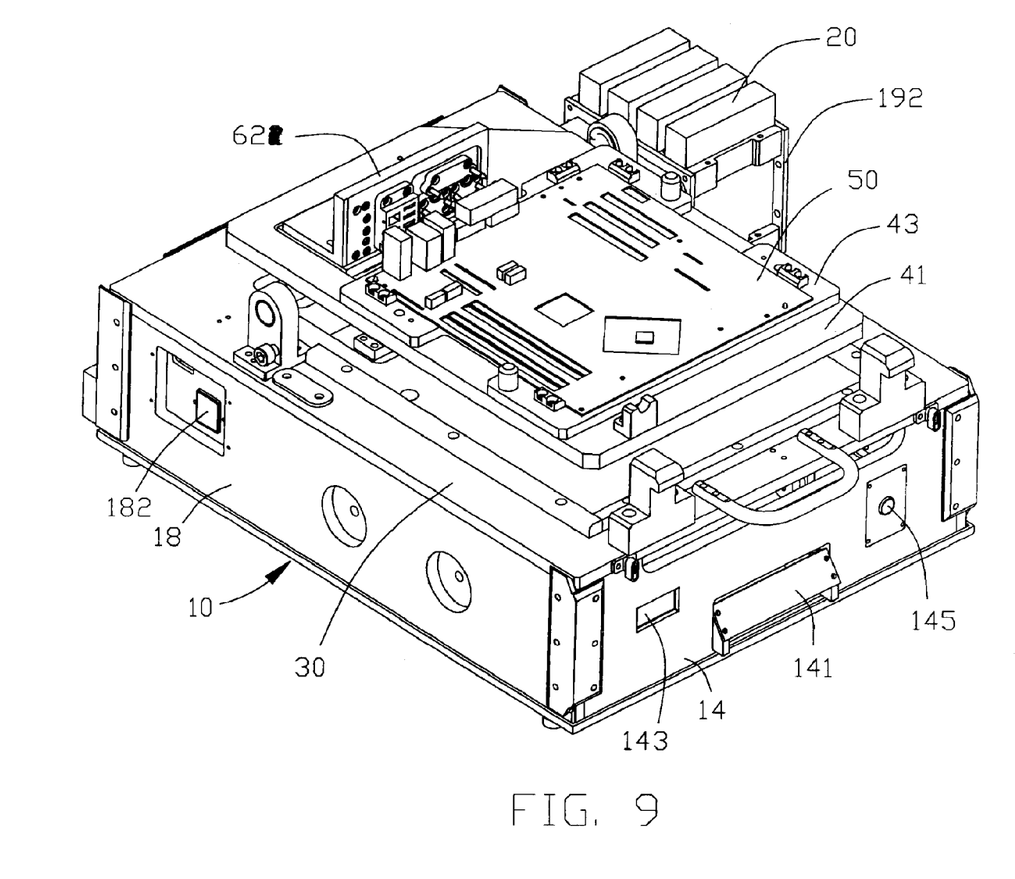
FIG. 9 is an assembled view of the base box, the raising board, the positioning board, and the motherboard.

In assembly of the motherboard test machine, the loading board 30 is pivoted down to a horizontal position and covers the base box 10. The locking blocks 147 of the base box 10 are rotated up to engage with the securing clips 306 of the loading board 30, thereby securing the loading board 30 thereon, as shown in FIG. 3. The raising board 41 is placed on the loading board 30 of the base box 10. The sliding posts 412 of the raising board 41 are inserted into the through holes 302 of the loading board 30. The locating portion 416 is adjacent to the hook portion 305 of the loading board 30. The rear test device 60 is installed on a rear portion of the base box 10, and revealed through the through opening 304 of the loading board 30 and the small opening 414 of the raising board 41, as shown in FIG. 9. The top test device 70 is pivotably secured to the base box 10, with the pivot posts 95 of the top testing board 90 pivotably secured into the pivot holes 3031 of the loading board 30, as shown in FIG. 1. The blocking board 80 is secured to the bottom surface of the top testing board 90. The blocking posts 92 of the top test board 90 are inserted through the corresponding through holes 86 of blocking board 80 respectively. The handle 93 is secured to the top testing board 90 through the connecting shafts 934 with fasteners, such as screws (not shown).

The control system is switched on and off with the button switch 145 of the base box 10, thereby controlling the testing process, and the air cylinders 301, 647.

Referring to FIG. 1, before testing the motherboard 50, the top test device 70 is rotated up. Then the motherboard 50 is placed on the positioning board 43, between the blocking portions 434. Two securing holes 52 of the motherboard 50 align with the positioning holes 439 of the positioning board 43. The motherboard 50 and the positioning board 43 are then together placed on the raising board 41, as best shown in FIG. 5. The locating pins 419 of the raising board 41 are inserted through the positioning holes 439 of the positioning board 43 and the securing holes 52 of the motherboard 50, thereby securing the motherboard 50 onto the base box 10. The I/O ports 55 of the motherboard 50 align with the test ports 622 of the rear test device 60. The CPU is secured to the CPU socket 59 of the motherboard 50.

Figure 10:
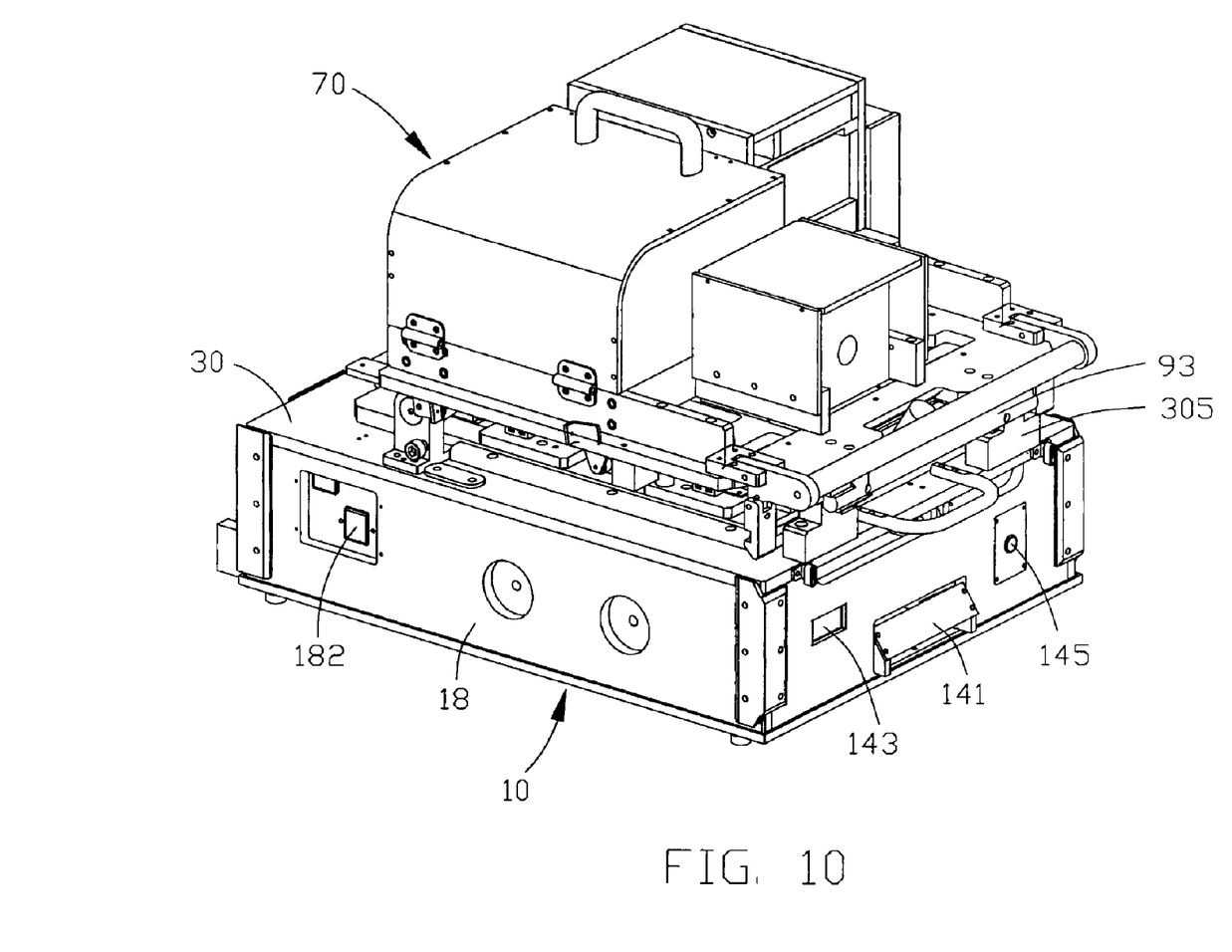
FIG. 10 is an assembled, isometric view of the motherboard test machine.

Referring also to FIG. 10, the top test device 70 is then rotated down. The handle 93 abuts against the hook portions 305 of the loading board 30. Then the handle 93 is pulled out, thereby the connecting shafts 934 being elongated. The handle 93 can thus pass across the hooks 3051 of the hook portions 305 of the loading board 30, and then the connecting shafts 934 retract. The handle 93 is locked by the hooks 3051 of the hook portions 305. The top test device 70 is thus secured on the loading board 30 of the base box 10.

Figure 12:
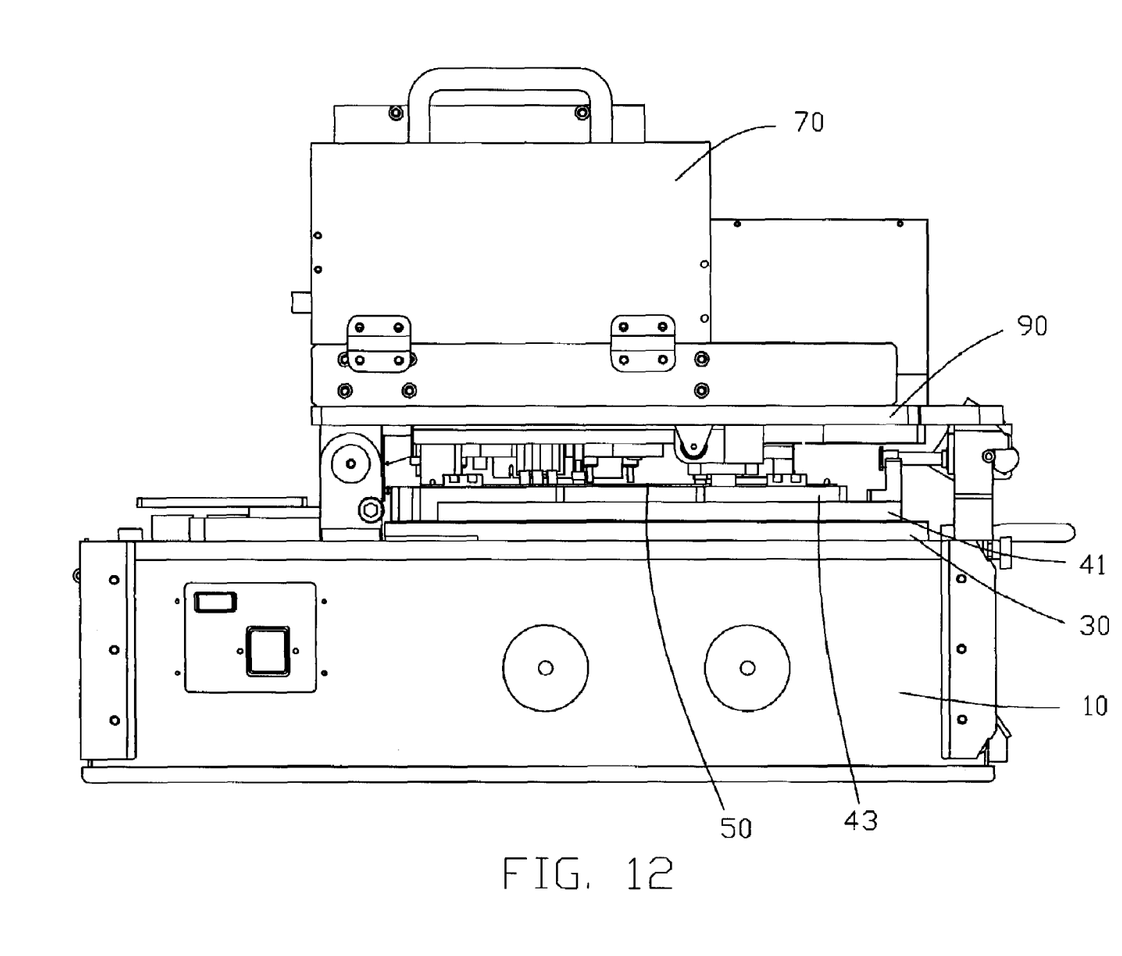
FIG. 12 is similar to FIG. 11, but showing the motherboard machine in testing.

Referring also to FIGS. 10 and 12, in the beginning of the testing, the power switch 182 of the base box 10 is used to turn on the power to start the test machine. The air cylinders 301, 647 are controlled by the control system. The driving post 308 of the air cylinder 301 urges the raising board 41 up. The raising board 41 is stably raised due to the sliding posts 412 of the raising board 41 being slidingly received and guided by the through holes 302 of the loading board 30. When the motherboard 50 abuts against the blocking posts 92 (shown in FIG. 1) of the top test board 90, the peripheral elements on the top test board 90 are positioned on the motherboard 50 at suitable positions, such as inserting into the PCI slots 58, via the through openings 81 of the blocking board 80. The air cylinder 647 of the rear test device 60 drives the sliding body 646 together with the test board 62 to slide out along a horizontal direction, until the test ports 622 of the test board 62 connect with the PCI ports 55 of the motherboard 50. Then the test machine starts up and tests the circuitry of the motherboard 50. The first display panel 141 displays the status of the testing process.

Figure 11:
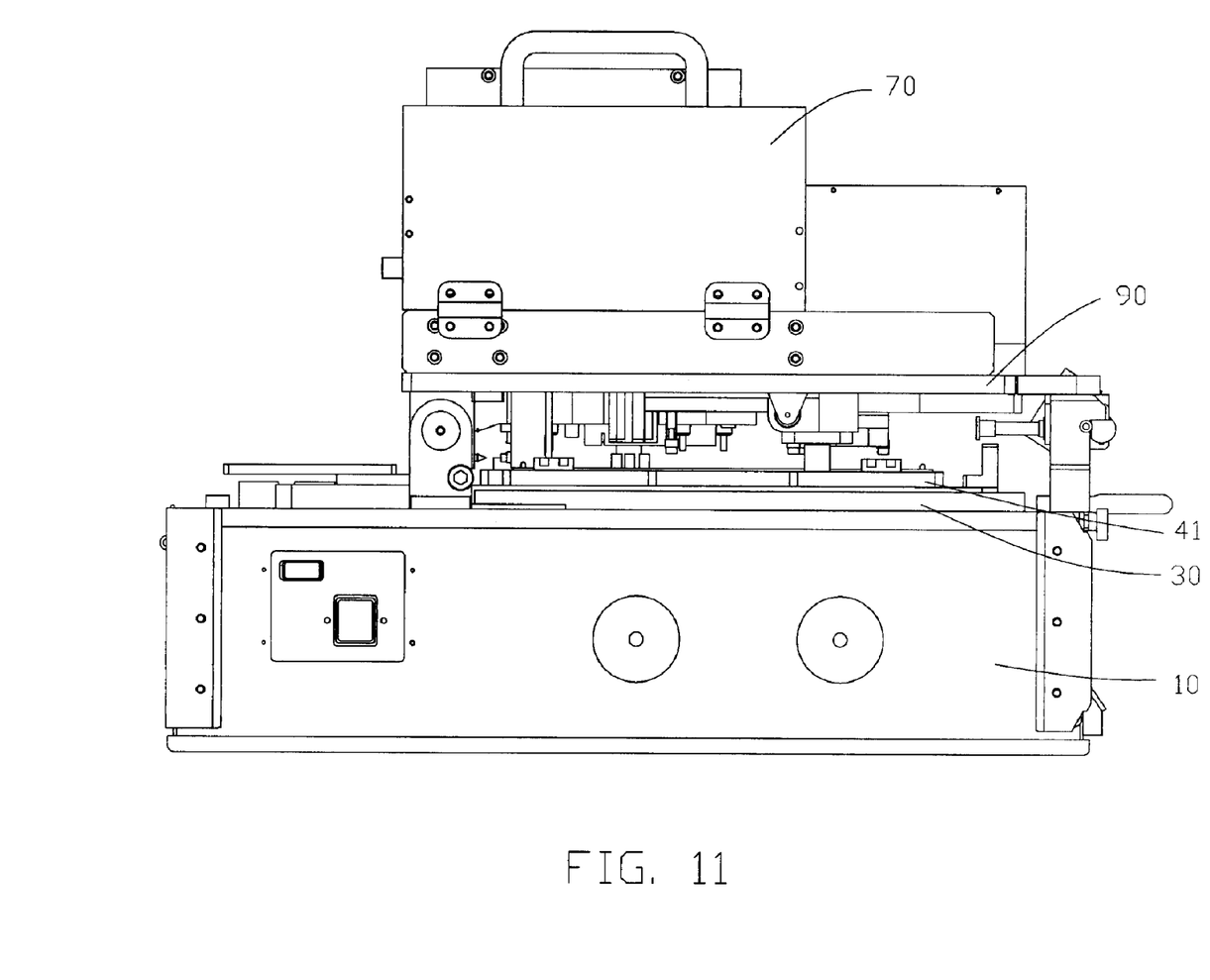
FIG. 11 is a left view of FIG. 10, and showing the motherboard test machine at the end of testing.

Referring also FIGS. 1 and 11, after finishing the test, the second display panel 143 displays the results of the testing process. The control system charges the air cylinders 301, 647 to drive the raising board 41 and the test board 62 to slide reversely. When the motherboard 50 disengages from the peripheral elements and the test ports 622, the handle 93 is pulled out to disengage from the hook portion 305. The top test device 70 can be thus rotated up and the motherboard 50 taken out from the test machine.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A test machine for testing a printed circuit board, comprising:
 a base box;
 a top test device pivotably attached to the base box, the top test device comprising at least one peripheral element;
 a raising board upliftably supported on the base box, the raising board being configured for carrying the printed circuit board and lifting the printed circuit board toward the top test device to connect the at least one peripheral element with the printed circuit board; and
 a rear test device, the rear test device comprises a securing board, a sliding body slidingly installed on the securing board, a test board secured on the sliding body for testing the PCB, and an air cylinder for driving the sliding body with the test board to slide.

2. The test machine of claim 1, further comprising a control system which comprises an air cylinder under a loading board of the base box, and a driving post connected with the air cylinder and extending through the loading board for lifting the raising board.

\* \* \* \* \*